United States Patent
Weigel et al.

(10) Patent No.: US 7,999,355 B2
(45) Date of Patent: Aug. 16, 2011

(54) AMINOSILANES FOR SHALLOW TRENCH ISOLATION FILMS

(75) Inventors: Scott Jeffrey Weigel, Allentown, PA (US); Mark Leonard O'Neill, Allentown, PA (US); Bing Han, Lansdale, PA (US); Hansong Cheng, Allentown, PA (US); Manchao Xiao, San Diego, CA (US); Chia-Chien Lee, Chupei (TW)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 12/492,201

(22) Filed: Jun. 26, 2009

(65) Prior Publication Data

US 2010/0009546 A1   Jan. 14, 2010

Related U.S. Application Data

(60) Provisional application No. 61/080,058, filed on Jul. 11, 2008.

(51) Int. Cl.
*H01L 21/3105* (2006.01)
(52) U.S. Cl. ............... 257/632; 257/642; 257/E21.242; 106/287.11
(58) Field of Classification Search ........... 257/632, 257/642; 106/287.11
See application file for complete search history.

(56) References Cited

U.S. PATENT DOCUMENTS

| | | |
|---|---|---|
| 4,983,546 A | 1/1991 | Hyun et al. |
| 5,451,655 A | 9/1995 | Linde et al. |
| 5,492,736 A | 2/1996 | Laxman et al. |
| 5,744,196 A | 4/1998 | Laxman et al. |
| 5,874,368 A | 2/1999 | Laxman et al. |
| 6,153,261 A | 11/2000 | Xia et al. |
| 6,432,843 B1 | 8/2002 | Kim et al. |
| 6,479,405 B2 | 11/2002 | Lee et al. |
| 6,489,252 B2 | 12/2002 | Goo et al. |
| 6,635,586 B2 | 10/2003 | Goo et al. |
| 6,706,646 B1 | 3/2004 | Lee et al. |
| 6,797,607 B2 * | 9/2004 | Endisch et al. ............... 438/623 |
| 6,869,860 B2 | 3/2005 | Belyansky et al. |
| 7,015,144 B2 | 3/2006 | Hong et al. |
| 7,037,840 B2 | 5/2006 | Katz |
| 7,053,005 B2 | 5/2006 | Lee et al. |
| 7,153,783 B2 | 12/2006 | Lu et al. |
| 7,179,537 B2 | 2/2007 | Lee et al. |
| 7,192,891 B2 | 3/2007 | Goo et al. |
| 7,223,802 B2 | 5/2007 | Aoki et al. |
| 7,270,886 B2 | 9/2007 | Lee et al. |
| 2002/0055271 A1 | 5/2002 | Lee et al. |
| 2005/0106762 A1* | 5/2005 | Chakrapani et al. ............. 438/4 |
| 2005/0239264 A1 | 10/2005 | Jin et al. |
| 2006/0051929 A1 | 3/2006 | Jin et al. |
| 2007/0219336 A1 | 9/2007 | Ito |
| 2007/0275166 A1 | 11/2007 | Thridandam et al. |

FOREIGN PATENT DOCUMENTS

| | | |
|---|---|---|
| CN | 101010399 A | 8/2007 |
| EP | 1 278 238 A1 | 1/2003 |
| EP | 1 500 685 A1 | 1/2005 |
| EP | 1 608 012 A1 | 12/2005 |
| EP | 1 768 175 A1 | 3/2007 |
| EP | 1 380 612 B1 | 5/2007 |
| EP | 1 002 824 B1 | 6/2009 |
| KR | 1991-008980 | 10/1991 |
| KR | 0147499 | 8/1998 |
| KR | 0611115 | 5/2002 |

* cited by examiner

*Primary Examiner* — Alexander G Ghyka
(74) *Attorney, Agent, or Firm* — Geoffrey L. Chase

(57) ABSTRACT

The present invention is a process for spin-on deposition of a silicon dioxide-containing film under oxidative conditions for gap-filling in high aspect ratio features for shallow trench isolation used in memory and logic circuit-containing semiconductor substrates, such as silicon wafers having one or more integrated circuit structures contained thereon, comprising the steps of:
  providing a semiconductor substrate having high aspect ratio features;
  contacting the semiconductor substrate with a liquid formulation comprising a low molecular weight aminosilane;
  forming a film by spreading the liquid formulation over the semiconductor substrate;
  heating the film at elevated temperatures under oxidative conditions.
Compositions for this process are also set forth.

1 Claim, No Drawings

AMINOSILANES FOR SHALLOW TRENCH ISOLATION FILMS

CROSS REFERENCE TO RELATED APPLICATION

The present patent application claims the benefit of U.S. Provisional Patent Application Ser. No. 61/080,058 filed Jul. 11, 2008.

BACKGROUND OF THE INVENTION

Currently the electronics fabrication industry is struggling with uniformly filling high aspect ratio (HAR) trenches with a spin-on material that has minimal shrinkage, i.e. <20%, at 1000° C. for 60 minutes under oxidative environments, produces high quality thermal oxide, results in a material with compressive stress, has equivalent electrical and mechanical properties as thermal oxide, and is capable of planarizing a variety of features. All of these properties must be met for consideration in front end of the line (FEOL) processes. The current material, polysilazane, works well, but it appears that it exhibits compositional gradients, suffers from significant out-gassing, has significant storage stability issues, and is expensive.

Relevant prior art in this area includes: U.S. Pat. No. 7,270,886; U.S. Pat. No. 7,192,891; U.S. Pat. No. 7,179,537; U.S. Pat. No. 7,053,005; U.S. Pat. No. 7,015,144; U.S. Pat. No. 6,706,646; U.S. Pat. No. 6,635,586; U.S. Pat. No. 6,489,252; U.S. Pat. No. 6,479,405; U.S. Pat. No. 6,432,843; U.S. Pat. No. 7,037,840; U.S. Pat. No. 6,869,860; EP1 768 175; EP1 608 012; EP1 278 238; EP1 380 612; EP1 002 824; EP1 500 685; U.S. Pat. No. 7,153,783; U.S. Pat. No. 6,167,172; US2006/0051929(A1); US2005/0239264(A1); and U.S. Pat. No. 7,223,802.

BRIEF SUMMARY OF THE INVENTION

The present invention is a process for spin-on deposition of a silicon dioxide-containing film for gap-filling of high aspect ratio features used in memory and logic circuit-containing semiconductor substrates, such as silicon wafers having one or more gap-fillable features, comprising the steps of:

providing a semiconductor substrate having high aspect ratio features;

contacting the semiconductor substrate with a liquid formulation comprising an aminosilane;

forming a film by spreading the liquid formulation over the semiconductor substrate and gap-filling the gap-fillable features with the film;

heating the film at elevated temperatures under oxidative conditions.

Compositions for this process are also contemplated.

DETAILED DESCRIPTION OF THE INVENTION

The present invention is the use of aminosilanes, for example diisopropylaminosilane (DIPAS) and bis(tert-butylamino)silane (BTBAS), to produce silicon dioxide under oxidative conditions for gap-filling of high aspect ratio (HAR) features, typically for shallow trench isolation (STI) used in front end of the line (FEOL) memory and logic semiconductor substrates, such as silicon wafers having one or more integrated circuit structures contained thereon. Shallow trenches can have high aspect ratios, based upon the depth to width dimensions, despite the trench being termed; shallow, particularly in comparison to other electrical devices and/or features in integrated circuit designs and manufacture, where the depth of a depression or trench could be greater than its width, sometimes several orders of depth greater than width, thus creating a HAR feature. This would be a gap fillable feature for the process and compositions of the present invention. The purity of the silicon dioxide used for the isolation of the devices is crucial to insure that there is no shorting, no excessive electrical leakage current, and the proper dielectric constant of the film is maintained over the lifetime of the device. Any issues with the insulating materials in the FEOL could result in transistor malfunction and cross-talk between adjacent devices, thereby affecting the performance of the entire electronic product. Therefore, the control of the solvent, choice of chemical precursors, and the process used to create the film are important, so as to make silicon dioxide films equivalent to Sub-Atmospheric pressure Chemical Vapor Depositions ("SACVD"), e.g. tetraethoxysilane (TEOS) in the presence of ozone, or thermal processes.

Benefits of our composition include:

1. Use of novel molecular class to prepare the STI—aminosilanes such as di-isopropylaminosilane (DIPAS), bis(tertiarybutylamino)silane (BTBAS), acetoxyethyltris(dimethylamino)silane, hexamethylcyclotrisilazane, tetraisocyanatosilane, tetrakis(dimethylamino)silane, tris-(tert-butylamino)silane, and other aminosilanes that have N bonded directly to Si and are not polymeric in nature. A general formula may be: $R_{(4-x)}Si(NR'R'')X$, where x=1-4; R can be independently the same or varied amongst halogens, alkoxy, acetoxy, hydrogen, and monovalent organic groups; R' and R" can be independently the same or varied between hydrogen and monovalent organic groups. The term "monovalent organic group" as used herein comprises an organic group bonded to an element of interest, such as Si, N, or O, through a single C bond, i.e., Si—C, N—C, or O—C. Monovalent organic groups comprise an alkyl group, an aryl group, an unsaturated alkyl group, and/or an unsaturated alkyl group substituted with alkoxy, ester, acid, carbonyl, or alkyl carbonyl functionality. Preferably, the alkyl group is a linear, branched, or cyclic alkyl group having from 1 to 5 carbon atoms, most preferably a methyl, ethyl, propyl, butyl, or pentyl group. The aryl groups preferably comprise phenyl, methylphenyl, ethylphenyl and fluorophenyl. In certain preferred embodiments, one or more hydrogen atoms within the alkyl group may be substituted with an additional atom such as a halide atom (i.e., fluorine), or an oxygen atom to give a carbonyl, ester, or ether functionality.

2. Use of the aminosilanes with other sources of silicon or silica, e.g. alkoxysilanes, chlorosilanes, cyclic siloxanes, disilanes, polysilanes, cyclic polysilanes, carbosilanes, cyclic carbosilanes, polycarbosilanes, silicic acid, fumed silica, colloidal silica suspensions, so that upon hydrolysis of the aminosilane the resulting by-products, e.g. amines, can catalyze additional hydrolysis and condensation reactions in the other sources of silicon or silica to create dense films.

3. Capability to produce high quality $SiO_2$-like films with a variety of dielectric constants ranging from 4.5 to as low as 2.3 with high mechanical strength and low wet etch rates.

4. Films produced have shrinkages that are with specifications for STI, <30%, but more preferably <20% after curing under oxidative conditions at a maximum temperature of 1000° C. for 60 minutes or at the desired annealing temperature to produce high density films.

5. Ambient storage stability of the solutions may be required. Criteria to judge the stability of the solution include no gellation or particle generation in the liquid after two weeks and the properties of the films produced from the mixture remain unchanged, e.g. maintains the proper uniformity across 300 mm wafers, less than 2% change in dielectric constant, less than 1.5% change in refractive index, no change in wet etch rate, no change in the mechanical properties.
6. Ultra-violet (UV) curing of the film may also be a possibility to enhance the performance of the material. The process of thermal+UV curing may be an advantage to controlling the thermal budget of the film.

Although not wanting to be limited to a particular theory, the present inventors believe that a $Si_3N_4$ polymer precursor, upon film formation, will shrink, but not to the same extent as oxide-based precursors during the soft bake and anneals at elevated temperatures. The bonding of the nitrogen requires that three other atoms be bonded, whereas oxygen requires only two. Upon oxidation of the $Si_3N_4$ polymer, the nitrogen in the film will be replaced by oxygen since the oxides are the thermodynamically favored phase. This replacement of nitrogen with oxygen creates a change in the bonding of the $Si_3N_4$ polymer, every two nitrogen atoms are replaced by three oxygen atoms, thereby causing a volume expansion in the structure. Although there is shrinkage occurring in the film as it is soft baked and annealed, the structural expansion counteracts the effects of condensation resulting in a film that may have a net zero shrinkage. Based upon these considerations, the present invention preferably uses precursors that would have relatively less or a minimal amount of C and O, while having relatively more or maximizing the amount of Si, N, and H.

The present invention's approach is to use molecules that form dense oxides at low temperatures, such as DIPAS and BTBAS. Using the hydrolysis chemistry of such molecules and their reactivity towards moisture, the mixture of the present invention can be catalyzed or self-catalyzed to create a variety of films, which when soft-baked and annealed at 1000° C. in an oxidative environment results in films with dielectric constants ranging from 4.0 to 2.3. The in situ amine catalysts allow the process of the present invention to use a variety of alkoxy and acetoxy silanes in conjunction with the aminosilanes, so that the oxygen/nitrogen content of the film can be adjusted to reach the desired film hardness, dielectric constant, wet etch rate, purity of the the silicon dioxide, and gap-fill characteristics for use in FEOL applications. Since many of the aminosilanes are highly reactive towards moisture, the process of the present invention preferably uses solvents to hydrolyze the silane, yet not be so reactive as to cause complete gelation of the mixture. The solvents of the present invention preferably have the proper boiling point, surface tension, and viscosity to prepare uniform films across 300 mm wafers, gap-fill features, and allow the mixture to adequately wet any passivation layers, such as CVD silicon nitride or silicon oxide. Glycol ethers, alcohols ($C_2$-$C_6$), glycol ether acetates, esters, amines, amides, ketones prepare suitable films with good uniformity. Particularly, ethanol, isopropanol, propanol, and pentanol are good solvents.

Using this approach, the present inventors have been able to prepare pure $SiO_2$ films, with reasonable mechanical properties, low dielectric constants, low wet etch rates in 100:1 water:HF, that do not crack after curing at 1000° C. The viscosities of the solutions are low, therefore gap-filling issues are minimized.

Mixtures of the present invention are made by adding the aminosilane(s) and/or alkoxysilanes to a high density polyethylene (HDPE), glass, or Teflon container. The solvent is then added slowly, so as not to hydrolyze the aminosilane too quickly. Any heat generated from the hydrolysis should dissipate prior to further processing. The solution is then allowed to age overnight. Typically, two wafers were spun from the solution; a low resistivity wafer (0.01-0.02 ohm) for electrical measurements and a high resistivity wafer (50 ohm and higher) for Fourier transform infra-red spectroscopy (FTIR), mechanical, and wet chemical etching. Approximately 2 mls of solution were dispensed through a 0.5 micron Teflon filter directly onto the wafer spinning at 500 rpm for 10 seconds in an open bowl configuration. After dispense was complete, the wafer was accelerated to 3500 rpm for 30 seconds to dry the film. The spinning conditions can be modified to change the thickness of the film. The films are soft-baked in air on hot plates. The soft bake conditions can be thermal, UV, electron beam, plasma, monochromatic light, and x-rays and can be conducted under inert, vacuum, oxidizing, or reductive atmospheres. Representative staged soft-baked temperatures and times are 90° C. [90 sec], 180° C. [90 sec], and 400° C. [180 sec]. Preferably, the film is cured at a soft-bake temperature in the range of 50° to 500° C. The wafers are annealed in a furnace and ramped at 10° C./min to 1000° C. Preferably, the film on the wafer is annealed at a temperature in the range of 500° to 1500° C. The anneal conditions can be thermal, UV, electron beam, plasma, monochromatic light, and x-rays and can be conducted under inert, vacuum, oxidizing, or reductive atmospheres. Preferably, the wafers are thermally annealed in a furnace under inert, dry oxidative, or steam atmospheres. The wafers are held at temperatures ranging from 700-1000° C.

The film thickness, refractive index (RI), and extinction coefficient at 240 nm are measured on a Film-Tek reflectometer using Film-Tek 2000 software to model the data.

The dielectric constant was determined according to ASTM Standard D150-98. The capacitance-voltage of each film was obtained at 1 MHz with a Solartron Model SI 1260 Frequency Analyzer and MSI Electronics Model Hg 401 single contact mercury probe. The error in capacitance measurements and mercury electrode area (A) was less than 1%. The substrate (wafer) capacitance ($C_{Si}$), background capacitance ($C_b$) and total capacitance ($C_T$) were measured between +20 and −20 volts and the thin film sample capacitance ($C_s$) was calculated by:

$$C_s = C_{Si}(C_T - C_b)/[C_{Si} - (C_T - C_b)]$$

The dielectric constant of the film was calculated by the equation below, wherein d is the film thickness, A is the mercury electrode area, and $\epsilon_0$ is the dielectric constant in vacuum:

$$\varepsilon = \frac{C_s d}{\varepsilon_0 A}$$

The total error of the dielectric constant of the film was expected to be less than 6%.

The elastic modulus for each film was taken from 1×0.4 $cm^2$ samples cleaved from the center of the wafer and mounted onto an aluminum stub using a low-melting-temperature adhesive, CRYSTALBOND® which is manufactured by Armco Products Inc., of Valley Cottage, N.Y. Indentation tests were performed on a NANOINDENTER® Dynamic Contact Module (DCM) manufactured by MTS Systems Corporation with an ACCUTIP™ Berkovich diamond tip, using the continuous stiffness measurement ("CSM") method described in the reference, Oliver et al., "An improved technique for Determining Hardness and Elastic Modulus Using Load and Displacement Sensing Indentation Experiments", J. Material Research, 1992, 7 [6], pp.1564-1583. A small oscillation was superimposed on the primary loading signal and the resultant system response was analyzed by means of a frequency-specific amplifier. The excitation frequency was held constant throughout the test at 75 Hz (DCM) and the excitation amplitude was controlled, such that the resulting displacement amplitude remained constant at 1 nm (DCM).

Each indentation experiment allowed for a continuous measure of the contact stiffness, S. Using the dynamic measure of S, and established formulae for Young's modulus and hardness (Poisson's Ratio=0.18 for silica, 0.25 for low κ films), every individual indentation experiment yielded Young's modulus and hardness as a continuous function of surface penetration. An array of 5 to 10 indents was performed on each sample and a distance of approximately 20-25 microns separated successive indents. The results from each indentation experiment were examined and any "outliers" were excluded. The results for Young's modulus and hardness vs. penetration for the indentation experiments of each sample were averaged using discrete displacement windows of approximately 5 nm. Using the data in this window, an average, standard deviation, and confidence interval for each sample were then calculated. The same statistics were likewise calculated for the rest of the discrete windows. Hardness results were obtained and averaged in the same manner. Hardness and Young's modulus were reported as the measured value of hardness at the minimum of the hardness curve (at about 30-50 nm) and the measured value of modulus at the minimum of the modulus curve (at about 30-50 nm). The errors of the modulus and the hardness of the film are expected to be less than 10 percent.

Wet chemical etch rates were done by exposing soft-baked and annealed films to 1:100 HF:water at several different times. The samples were removed periodically to measure the thickness of the film. The thickness of the film was plotted against the time of exposure. The slope of the line, typically linear fits of the data are adequate, determines the etch rate of the material.

To determine the initial composition of the film, FTIR was measured on a Nicolet Magna FTIR using a blank high resistivity Si wafer as the background. The experimental spectra for each film was collected using 32 scans were collected with a resolution of 4 cm$^{-1}$. All of the experimental spectra were baseline corrected and normalized to 500 nm, so that peak areas and heights could be compared. The hydrocarbon (3200-2800 cm$^{-1}$), SiH$_x$ (2300-2000 cm$^{-1}$), Si—CH$_3$ (1300-1250 cm$^{-1}$), and SiO (1000-1250 cm$^{-1}$) peak areas were integrated after baseline correction and normalization. Peak height was determined for the SiO region.

EXAMPLES 1-14

All of the solutions in Table 1 were mixed in the same manner: the silica source(s) was added to the bottle first. The solvent was then added slowly to minimize heat generation. The bottles were shaken vigorously. Solutions were aged overnight under ambient conditions prior to spinning.

The solution is dispensed, approximately 2 mls, onto a Si wafer while rotating at 500 rpm for 7-10 seconds. The wafer is accelerated to 1800 rpm for 40 seconds or until the film is dry. The wafer is removed from the spin coater, soft-baked at 90° C. for 90 seconds and 400° C. for 180 seconds in air. The film is then annealed at 1000° C. in air for 60 minutes, resulting in an essentially pure SiO$_2$ film.

TABLE 1

Solution Preparations for examples 1-14

| Ex. # | Silica 1 | Silica 2 | Solvent | Catalyst |
|---|---|---|---|---|
| 1 | 6 g BTBAS | — | 2 g 1-pentanol | |
| 2 | 4.1 g TEOS | 0.4 g PTES | 2 g EtOH | 2.4 g 0.05 M HCl |
| 3 | 6 g BTBAS | — | 0.5 g EtOH | |
| 4 | 6 g BTBAS | — | 1.5 g 1-propanol | |
| 5 | 6 g DIPAS | — | 1 g 1-pentanol | |
| 6 | 4.8 g BTBAS | 1.2 g PTES | 1 g 1-pentanol | |
| 7 | 4.8 g BTBAS | 1.2 g HTES | 1 g 1-pentanol | |
| 8 | 4.8 g BTBAS | 1.2 g DIPAS | 1 g 1-pentanol | |
| 9 | 3 g DIPAS | — | 3 g 1-propanol | |
| 10 | 3 g DIPAS | — | 1.5 g 1-propanol | |
| 11 | 4.8 g BTBAS | 1.2 g DIPAS | 1 g 1-propanol | |
| 12 | 3.6 g BTBAS | 2.4 g DIPAS | 1 g 1-propanol | |
| 13 | 2.4 g BTBAS | 3.6 g DIPAS | 1 g 1-propanol | |
| 14 | 1.2 g BTBAS | 4.2 g DIPAS | 1 g 1-propanol | |

The properties of the film after the soft-bakes and anneal are shown in Table 2.

TABLE 2

Film Properties of examples 1-14

| Ex # | RI | shrinkage | k | Modulus (GPa) | Hardness (GPa) | SiO pk area (FTIR) | Wet Etch Rate (nm/min) |
|---|---|---|---|---|---|---|---|
| 1 | 1.2778 | 0.25 | 2.57 | 21.0 | 2.6 | 42.2 | 124 |
| 2 | 1.446 | 0.35 | | 72.2 | 10.4 | 65.5 | 2.2 |
| 3 | 1.341 | 0.25 | | | | 57.9 | 1.7 |
| 4 | 1.415 | 0.33 | 3.6 | 20.5 | 2.4 | 48.0 | 113 |
| 5 | 1.446 | 0.18 | 2.39 | | | 50.5 | 26 |
| 6 | 1.338 | 0.28 | | 7.1 | 0.8 | 29.7 | 153 |
| 7 | 1.431 | 0.13 | 2.99 | | | 64.3 | 24.6 |
| 8 | 1.404 | 0.32 | | 59.1 | 8.4 | 60.1 | 3.4 |
| 9 | 1.4787 | 0.28 | 2.61 | | | | |
| 10 | 1.1519 | 0.05 | 2.23 | | | | |
| 11 | 1.4535 | 0.18 | 3.95 | | | | |
| 12 | 1.4538 | 0.22 | 3.94 | | | | |
| 13 | 1.4383 | 0.24 | 3.62 | | | | |
| 14 | 1.4431 | 0.21 | 3.33 | | | | |

EXAMPLE 15

Other silica sources can be used as both a catalyst and as a reagent to incorporate silicon into the growing silicon containing polymer. 3.6 g BTBAS, and 2.4 g DIPAS are combined together in a Teflon or glass bottle. 1 g of 1-propanol is added slowly to the aminosilane solution, so as to minimize the amount of heat that is generated. The bottle is agitated to insure that the solution is homogeneous. 0.06 g of silicic acid is added to the mixture. The solution is agitated overnight to aid in the dissolution of the silicic acid. Any undissolved silicic acid is removed with filtration.

The material is dispensed, approximately 2 mls, onto a Si wafer while rotating at 500 rpm for 7-10 seconds. The wafer is accelerated to 1800 rpm for 40 seconds or until the film is dry. The wafer is removed from the spin coater, soft-baked at 90° C. for 90 seconds and 400° C. for 180 seconds in air. The film is then annealed at 1000° C. in air for 60 minutes resulting in a pure SiO$_2$ film. The properties of the film after the soft-bakes are: film thickness=355.7 nm, RI=1.4473, shrinkage=11%. After the 1000° C. anneal, the properties are: film thickness=312.5 nm, RI=1.4386, shrinkage=11%.

EXAMPLES 16-17

Addition of Acid Catalysts

Acid and base catalysts are used quite commonly during the preparation of sol gel mixtures. The catalysts aid in the hydrolysis and condensation of the silicon containing monomers to form higher molecular weight polymeric species and help to control the pH of the mixture. Specific embodiments include carboxylic acids and inorganic acids.

6.8 g BTBAS, 10.2 g DIPAS are combined together in a Teflon or glass bottle. 3.5 g of isopropanol is added slowly to the aminosilane solution so as to minimize the amount of heat that is generated. The bottle is agitated to insure that the solution is homogeneous. The BTBAS/DIPAS solution is then heated for 4 hours at 50° C. After cooling the solution to 23° C., 0.1 g of 0.05 M acetic acid in water is added to the mixture. The solution is agitated for 1-2 hours, before allowing the mixture to age for 16-17 hours under ambient conditions. The order of addition and aging of the mixture is repeated, except that 0.1 g of 0.05 M formic acid replaces the 0.05 M acetic acid used previously.

The material is dispensed, approximately 2 mls, onto a Si wafer, while rotating at 500 rpm for 7-10 seconds. The wafer is accelerated to 1800 rpm for 40 seconds or until the film is dry. The wafer is removed from the spin coater, soft-baked at 90° C. for 90 seconds and 400° C. for 180 seconds in air. The film is then annealed at 1000° C. in air for 60 minutes, resulting in a pure $SiO_2$ film.

Table 3 summarizes the film properties of the two mixtures using carboxylic acids as the catalysts. The use of acid catalysts results in more dense films with lower film shrinkage after the soft-bake and anneal in air.

TABLE 3

| | | 400° C. | | | 1000° C. | | |
|---|---|---|---|---|---|---|---|
| Ex. | acid | Thickness (nm) | RI | Shrink (%) | Thickness (nm) | RI | Shrink (%) | SiO peak area |
| 16 | acetic | 222.5 | 1.4118 | 4 | 190.5 | 1.4463 | 14 | 74.7 |
| 17 | formic | 223.7 | 1.4444 | 6 | 195.3 | 1.4553 | 12 | 68.1 |

EXAMPLES 18-19

UV Curing of Aminosilane Films

Alternative soft-bake and annealing techniques can improve the density of the films by activating different condensation mechanisms. Other methodologies beyond thermal means include UV, electron beams, x-rays, monochromatic light sources at wavelengths less than 230 nm, and plasmas (either in situ or remote).

6.8 g BTBAS, 10.2 g DIPAS are combined together in a Teflon or glass bottle. 3.5 g of isopropanol is added slowly to the aminosilane solution so as to minimize the amount of heat that is generated. The bottle is agitated to insure that the solution is homogeneous. 0.1 g of 0.05 M hydrochloric acid in water is added to the mixture. The mixture is then heated for 2 hours at 70° C. The solution is aged for 16-17 hours under ambient conditions.

The material is dispensed, approximately 2 mls, onto a Si wafer while rotating at 500 rpm for 7-10 seconds. The wafer is accelerated to 1800 rpm for 40 seconds or until the film is dry. The wafer is removed from the spin coater, is UV cured in air using a Fusion broadband I300 system equipped with a H+ bulb for 60 seconds in air. A second wafer is treated in the same manner, except that the UV exposure time is 180 seconds. Both films are annealed at 1000° C. in air for 60 minutes, resulting in pure $SiO_2$ films.

Table 4 shows the film properties for these two films. It appears longer UV cure times results in films that shrink more at lower temperatures, but after annealing at 1000° C., the films shrink significantly less than the thermally treated films, yet still result in high quality $SiO_2$.

TABLE 4

| | | After UV cure | | 1000° C. | | | |
|---|---|---|---|---|---|---|---|
| Ex. | Exposure (sec) | Thickness (nm) | RI | Thickness (nm) | RI | Shrink (%) | SiO peak area |
| 18 | 60 | 194.4 | 1.4248 | 170.2 | 1.4499 | 12 | 76.4 |
| 19 | 180 | 152.4 | 1.4327 | 140.5 | 1.4516 | 8 | 78.5 |

EXAMPLE 20

Network Forming Silica Reagents

This example shows the use of network forming molecules to aid in increasing film density. 1,3,5,7-tetramethyl cyclotetrasiloxane (TMCTS) is used in this example, but any Si containing monomer that has the ability to create siloxane bridges through three or more hydroxyl, alkoxy, hydrido, or halogen functionalities can be used to accomplish the same networking as TMCTS. Examples of other network formers include tetraethoxysilane, tetraacetoxysilane, tetrachlorosilane, phenyltriethoxysilane, methyltriacetoxysilane, triethoxysilane, ethyltriethoxysilane, hexaethoxydisilane, hexaethoxydisiloxane, 1,3,5-trisilacyclohexane, and diethoxymethylsilane. This list is not meant to be all inclusive.

3.8 g BTBAS, 2.4 g DIPAS are combined together in a Teflon or glass bottle. 1 g of 1-propanol is added slowly to the aminosilane solution, so as to minimize the amount of heat that is generated. The bottle is agitated to insure that the solution is homogeneous. 0.7 g of TMCTS is added to the mixture. The solution is agitated for 2 hours prior to aging overnight.

The material is dispensed, approximately 2 mls, onto a Si wafer, while rotating at 500 rpm for 7-10 seconds. The wafer is accelerated to 1800 rpm for 40 seconds or until the film is dry. The wafer is removed from the spin coater, soft-baked at 90° C. for 90 seconds and 400° C. for 180 seconds in air. The film is then annealed at 1000° C. in air for 60 minutes resulting in a pure SiO2 film. The properties of the film after the soft-bakes are: film thickness=195.4 nm, RI=1.405, shrinkage=<1%. After the 1000° C. anneal, the properties are: film thickness=165.4 nm, RI=1.4642, shrinkage=15%.

Aminosilanes with alkoxysilanes can be used such as wherein the mixture comprises an aminosilane selected from a first group consisting of bis(tertiarybutylamino)silane and di-isopropylaminosilane and a chemical of a second group selected from the group consisting of di-isopropylaminosilane, triethoxysilane, tetraacetoxysilane, tetraethylorthosilicate, tetramethoxysilane, tetrapropoxysilane, phenyltriethoxysilane, phenyltriacetoxysilane, phenyltrimethoxysilane, methyltriethoxysilane, methylacetoxysilane, phenyltrimethoxysilane, ethyltriethoxysilane, ethyltrimethoxysilane, ethyltriacetoxysilane, hexaethoxydisilane, hexamethoxydisilane and mixtures thereof; where when the aminosilane of the first group is di-isopropylaminosilane, the chemical of the second group is not di-isopropylaminosilane.

Although the present invention has been described with reference to select embodiments, it should be understood that the full scope of the invention should include chemical vapor deposition (CVD) silicon oxide precursors, typical spin-on silicon oxide precursors, aminosilanes, dielectric restoration chemistry precursors capable of producing silicon oxides and additionally appropriate catalysts, water, solvents, additives (surfactants, flow additives); that can be formulated into a product for depositing silicon oxide films using a mixture of aminosilanes, acetoxysilanes, alkoxysilanes with a solvent with a boiling point useful in an open bowl configuration (130-170° C.); total solution should have low viscosities to be able to gap fill HAR trenches; the solution should be able to wet "$Si_xN_y$," and "$SiO_2$" films equally; and capable of moderate molecular weight polymerization during deposition/curing after gap-filling to facilitate planarization of patterned features.

Film properties will be as follows:
Upon curing with thermal, UV, or chemical treatments the film will have the following properties:

1. Result in pure $SiO_2$—the film will not contain carbon or nitrogen species;
2. Shrinkage of 25% or less after curing at 1000° C. for 60 minutes in an oxidative environment;
3. Dielectric constant between 2.0 and 4.0 (dielectric constant of less than 3.0 are quite unexpected for a solution processed film cured at 1000° C.);
4. Wet chemical etch rate with 100:1 DHF solution equivalent to thermal oxide (31 A/min);
5. Modulus and hardness equivalent to thermal oxide;
6. Stress in the file should be compressive and not tensile; and
7. No significant outgassing at high temperatures.

The invention claimed is:

1. A spin on composition useful for gap filling silicon dioxide depositions, comprising:
    an aminosilane selected from a first group consisting of bis(tertiarybutylamino)silane and di-isopropylaminosilane and a chemical of a second group selected from the group consisting of triethoxysilane, tetraacetoxysilane, tetraethylorthosilicate, tetramethoxysilane, tetrapropoxysilane, phenyltriethoxysilane, phenyltriacetoxysilane, phenyltrimethoxysilane, methyltriethoxysilane, methylacetoxysilane, phenyltrimethoxysilane, ethyltriethoxysilane, ethyltrimethoxysilane, ethyltriacetoxysilane, hexaethoxydisilane, hexamethoxydisilane and mixtures thereof;
    a solvent selected from the group consisting of glycol ethers, alcohols, glycol ether acetates, esters, amines, amides, ketones and mixtures thereof; and,
    catalyst selected from the group consisting of hydrochloric acid, nitric acid, formic acid, acetic acid, maleic acid, oxalic acid and mixtures thereof.

* * * * *